United States Patent
Ye et al.

(10) Patent No.: US 12,394,606 B2
(45) Date of Patent: Aug. 19, 2025

(54) IMPEDANCE CONTROL OF LOCAL AREAS OF A SUBSTRATE DURING PLASMA DEPOSITION THEREON IN A LARGE PECVD CHAMBER

(71) Applicant: Applied Materials, Inc., Santa Clara, CA (US)

(72) Inventors: Zheng John Ye, Santa Clara, CA (US); Andrew C. Lam, San Francisco, CA (US); Zeqiong Zhao, Santa Clara, CA (US); Jianhua Zhou, Campbell, CA (US); Hshiang An, Santa Clara, CA (US); Suhail Anwar, Saratoga, CA (US); Yoshitake Nakajima, Santa Clara, CA (US); Fu-Ting Chang, Tainan (TW)

(73) Assignee: Applied Materials, Inc., Santa Clara, CA (US)

(*) Notice: Subject to any disclaimer, the term of this patent is extended or adjusted under 35 U.S.C. 154(b) by 174 days.

(21) Appl. No.: 17/971,205

(22) Filed: Oct. 21, 2022

(65) Prior Publication Data

US 2024/0136160 A1 Apr. 25, 2024
US 2024/0234105 A9 Jul. 11, 2024

(51) Int. Cl.
*H01J 37/32* (2006.01)
*C23C 16/458* (2006.01)
(Continued)

(52) U.S. Cl.
CPC .... *H01J 37/32715* (2013.01); *C23C 16/4586* (2013.01); *C23C 16/505* (2013.01);
(Continued)

(58) Field of Classification Search
None
See application file for complete search history.

(56) References Cited

U.S. PATENT DOCUMENTS 5,474,648 A * 12/1995 Patrick ............. H01J 37/32935
  700/121
5,886,865 A * 3/1999 Parkhe ................. H02N 13/00
  361/233

(Continued)

FOREIGN PATENT DOCUMENTS

KR 10-2020-0069284 A 6/2020

OTHER PUBLICATIONS

International Search Report and Written Opinion dated Feb. 7, 2024 for Application No. PCT/US2023/077133.

*Primary Examiner* — Sylvia MacArthur
(74) *Attorney, Agent, or Firm* — Patterson + Sheridan, LLP

(57) ABSTRACT

Embodiments of the present disclosure generally relate to methods and apparatus for measuring and controlling local impedances at a substrate support in a plasma processing chamber during processing of a substrate. A substrate support includes a plurality of substrate support pins wherein the radio frequency voltage, current and phase of each of the plurality of substrate support pins are measured and impedances of the support pins are adjusted in real time. Each of the substrate support pins is coupled to an associated adjustable impedance circuit that may be remotely controlled. In one embodiment a variable capacitor is used to adjust the impedance of the impedance circuit coupled to the associated substrate support pin and may be remotely adjusted with a stepper motor. In another embodiment a microcontroller may control the impedance adjustments for all of the plurality of substrate support pins and may be used to track these impedances with each other and with a bulk impedance of the plasma processing chamber.

20 Claims, 7 Drawing Sheets

(51) Int. Cl.
    *C23C 16/505*     (2006.01)
    *C23C 16/52*     (2006.01)

(52) U.S. Cl.
    CPC ............ *C23C 16/52* (2013.01); *H01J 37/321* (2013.01); *H01J 37/32183* (2013.01); *H01J 2237/0262* (2013.01); *H01J 2237/20235* (2013.01); *H01J 2237/24564* (2013.01); *H01J 2237/3321* (2013.01); *H01J 2237/3323* (2013.01)

(56) References Cited

U.S. PATENT DOCUMENTS

| | | | |
|---|---|---|---|
| 6,100,773 | A | 8/2000 | Nakamichi et al. |
| 6,898,064 | B1 * | 5/2005 | Berman .............. H01L 21/6831 361/233 |
| 7,813,103 | B2 | 10/2010 | Shannon et al. |
| 8,111,499 | B2 | 2/2012 | Ni et al. |
| 10,228,414 | B2 | 3/2019 | Buffa et al. |
| 10,804,076 | B2 | 10/2020 | Yamazawa et al. |
| 2008/0099450 | A1 | 5/2008 | Lewington et al. |
| 2008/0302955 | A1 * | 12/2008 | Dzengeleski ....... H01J 37/3171 250/252.1 |
| 2009/0097185 | A1 | 4/2009 | Shannon et al. |
| 2009/0159439 | A1 * | 6/2009 | Pipitone ............ H01J 37/32183 204/298.03 |
| 2011/0058302 | A1 | 3/2011 | Valcore, Jr. et al. |
| 2014/0097175 | A1 * | 4/2014 | Yu ..................... H01L 21/68721 269/296 |
| 2015/0180503 | A1 * | 6/2015 | Schubert ................ G06F 30/367 341/143 |
| 2017/0076921 | A1 * | 3/2017 | Sakiyama ......... H01J 37/32935 |
| 2018/0342375 | A1 * | 11/2018 | Nguyen ................. C23C 16/46 |
| 2019/0382891 | A1 * | 12/2019 | Shao .................. C23C 16/4583 |
| 2020/0347499 | A1 | 11/2020 | Anwar et al. |
| 2021/0090777 | A1 | 3/2021 | Kudela et al. |
| 2021/0202209 | A1 * | 7/2021 | Van Zyl ............ H01J 37/32183 |
| 2022/0230850 | A1 * | 7/2022 | Mopidevi ........... G01R 15/181 |
| 2023/0067745 | A1 * | 3/2023 | Liu .................. H01J 37/32862 |
| 2024/0094273 | A1 * | 3/2024 | Guo ................. H01J 37/32917 |
| 2024/0136160 | A1 * | 4/2024 | Ye .......................... H01J 37/321 |

* cited by examiner

IMPEDANCE CONTROL OF LOCAL AREAS OF A SUBSTRATE DURING PLASMA DEPOSITION THEREON IN A LARGE PECVD CHAMBER

BACKGROUND

Field

Embodiments of the present disclosure generally relate to apparatus for depositing films on a substrate and, more specifically, to apparatus for facilitating uniform thickness of the films deposited on the substrate during plasma deposition thereon in a large plasma-enhanced chemical vapor deposition (PECVD) chamber.

Description of the Related Art

Plasma-enhanced chemical vapor deposition (PECVD) is a process where films may be deposited onto a substrate. Deposition of a variety of materials may be performed on a large area substrate. For plasma deposition and etching and other plasma utilizing processes, process uniformity and repeatability within a chamber, from chamber to chamber and processing system to processing system are parameters for controlling semiconductor device yield and semiconductor device performance tolerance so that the formed semiconductor devices are able to perform as designed.

Electronic devices, such as thin film transistors (TFT's), flat panel displays, photovoltaic (PV) devices, solar cells and other electronic devices have been fabricated on thin, flexible media for many years. The substrates may be made of silicon, glass, polymers, or other material suitable for electronic device formation. The substrates are typically processed in a tool that has multiple chambers, such as a cluster tool, and the substrates are transferred into and out of the various chambers that perform different processing operations to form the electronic devices thereon. To facilitate transfer of the substrates into and out of the chambers, substrate support pins are adapted to extend through an upper surface (top) of a substrate support when the substrate support is lowered. For example when the substrate support is lowered, the substrate is supported by the substrate support pins and remains in a stationary position, and the bottom of the substrate is vertically spaced apart from the top of the substrate support.

This spacing between the substrate and substrate support allows a transfer mechanism, such as a robot blade or end effector, to move between the bottom surface of the substrate and the top surface of the substrate support, allowing the substrate to be moved without causing damage to the substrate support or the substrate. When the substrate support is raised the top of the substrate support pins become substantially on the same plane as the top of the substrate support, thereby placing the substrate into contact with the top of the substrate support. The substrate support pins remain under the substrate during processing of the substrate in the plasma chamber.

However, the areas of the substrate where the substrate support pins are located suffer from sub-optimal deposition as compared to other areas of the substrate not over the substrate support pins. For example, the areas of the substrate corresponding to the locations of the substrate support pins have a film thickness that may be less than a film thickness as compared to other areas of the substrate not over the substrate support pins. The sub-optimal deposition of the substrate at locations corresponding to the locations of the substrate support pins may create problems in the final display product, one major problem being a "mura effect" or "clouding" of portions of the final display product, which typically corresponds to the locations of the substrate support pins.

Therefore, what is needed are apparatus and methods to prevent or minimize at least, the non-uniform deposition on areas of a substrate related to the locations of the substrate support pins.

SUMMARY

Embodiments of the disclosure include a plasma processing system that includes a substrate support disposed within a processing volume of the plasma processing system, the substrate support comprising a body having a plurality of openings formed between a substrate support surface and backside opposite the substrate support surface. The plasma processing system further includes a substrate support leg attached to the backside of the substrate support. An actuator attached to the substrate support leg and adapted to raise and lower the substrate support leg with the attached substrate support. The plasma processing system further includes a plurality of substrate support pins deposed in the plurality of openings of the substrate support and a plurality of adjustable impedance circuits in electrical communications with associated ones of the plurality of substrate support pins. When the substrate support is in a raised position, top portions of the plurality of substrate support pins are planar with or recessed below the substrate support surface. When the substrate support is in a lowered position the substrate support pins extend above the substrate support surface.

Embodiments of the disclosure include a plasma processing system that includes a plasma processing chamber, at least one plasma generating radio frequency (RF) coil within an upper portion of the plasma processing chamber, a RF power source, a RF impedance matching network coupled between the RF power source and the at least one plasma generating RF coil, a frequency detector, and first RF voltage and current detectors electrically coupled between the RF impedance matching network and the at least one plasma generating RF coil. The plasma processing system further includes a substrate support disposed within the plasma processing chamber and below the at least one plasma generating RF coil, the substrate support comprising a body having a plurality of openings formed between a substrate support surface and a backside opposite the substrate support surface. A substrate support leg attached to the backside of the substrate support. An actuator attached to the substrate support leg and adapted to raise and lower the substrate support leg with the attached substrate support. The plasma processing system further includes a plurality of substrate support pins deposed in the plurality of openings of the substrate support and a plurality of adjustable impedance circuits in electrical communications with associated ones of the plurality of substrate support pins. Second RF voltage and RF current detectors electrically coupled to each of the plurality of adjustable impedance circuits for detecting RF voltage and RF current thereof. When the substrate support is in a raised position, top portions of the plurality of substrate support pins are planar with or recessed below the substrate support surface of the substrate support. When the substrate support is in a lowered position the substrate support pins extend above the surface of the substrate support.

Embodiments of the disclosure include a method for improving plasma processing of a substrate that includes the operation of positioning a substrate support disposed within a processing volume of a plasma processing chamber, the substrate support includes a body having a plurality of openings formed between a substrate support surface and backside opposite the substrate support surface. The method further includes the operation of positioning a plurality of substrate support pins in the plurality of openings of the substrate support, where top portions of the plurality of substrate support pins are in planar alignment with or recessed below the substrate support surface of the substrate support. The method further includes the operation of placing a substrate to be processed on the surface of the substrate support and the top portions of the plurality of substrate support pins. The method further includes the operation of adjusting impedances of the plurality of adjustable impedance circuits during substrate processing, the adjustable impedance circuits in electrical communications with associated ones of the plurality of substrate support pins.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

Figure 1:
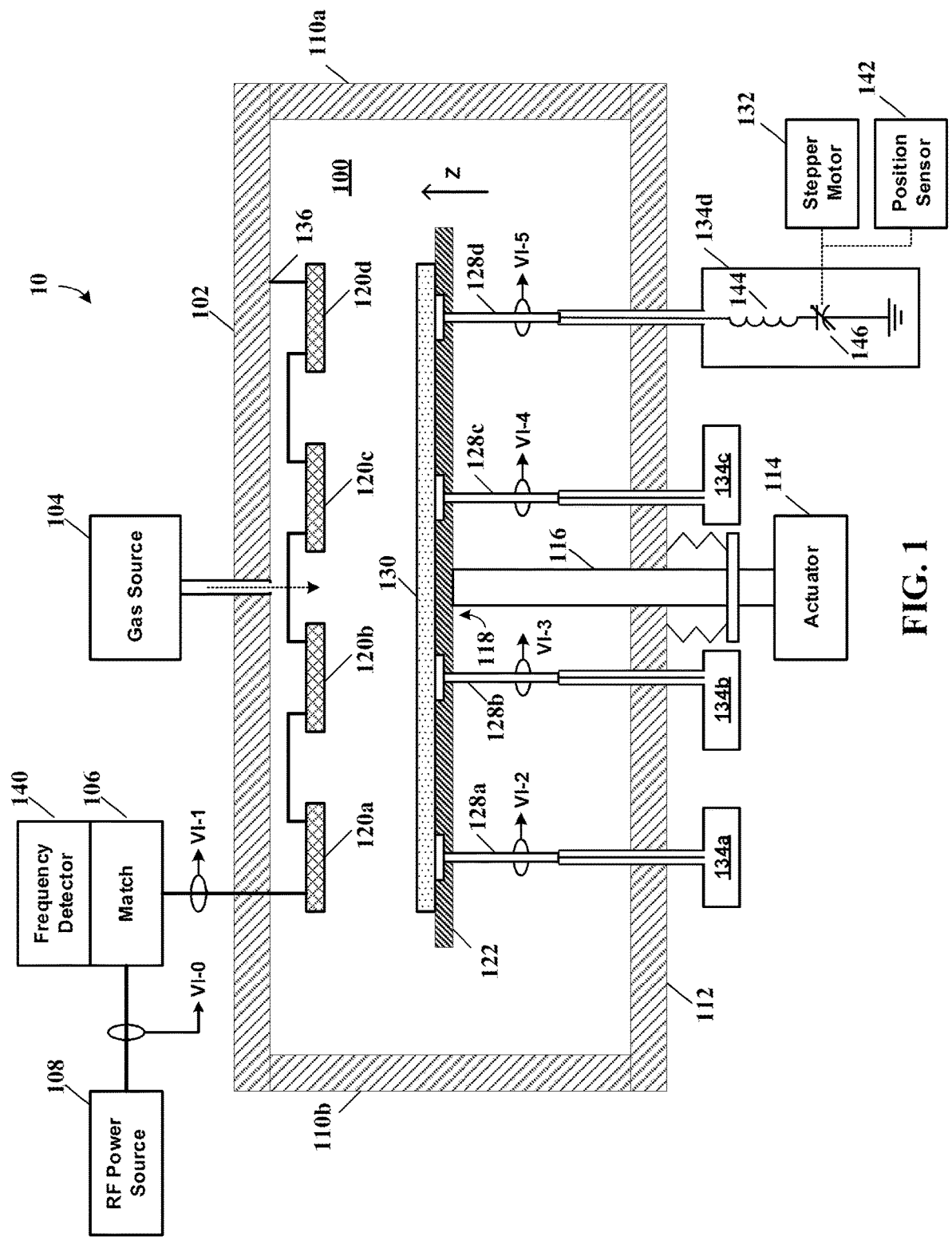
FIG. 1 illustrates a schematic cross-sectional front view of a plasma processing system with a substrate support in a first position, according to an embodiment.

To facilitate an understanding of the embodiments disclosed herein, identical reference numerals have been used, where possible, to designate identical elements that are common to the figures. It is contemplated that elements and features of one embodiment may be beneficially incorporated in other embodiments without further recitation.

DETAILED DESCRIPTION

Methods and apparatus are described herein to incorporate impedance control of local areas of a large substrate (flat panel displays) during plasma processing thereof using an array of radio frequency (RF) voltage, current and phase detectors and adjustable impedance networks (e.g., motorized vacuum capacitors) in a large PECVD chamber.

Embodiments of the present disclosure include apparatus and methods to prevent or substantially minimize non-uniform deposition of areas of a substrate coterminous with the substrate support pins. Due to electromagnetic discontinuity presented locally across an area of a large substrate, deposition film qualities including, but not limited to, thickness, refractive index (RI), and/or wet etch rate may exhibit local variations or a dip in film thickness. However, when the substrate support pins are used as a media to influence a local RF impedance, such variations in film properties may be minimized substantially into the surrounding background, facilitating improved deposition process yields and/or flat panel utilization for the end users.

Embodiments of the disclosure determine RF voltage, current and phase (impedance) at each location of the substrate support pins and control the impedance thereof with an adjustable impedance circuit coupled to an associated substrate support pin. Each impedance network may comprise series connected lumped circuit elements such as an inductor and capacitor or multiple combinations thereof. An example embodiment of such a series connected lumped inductor and capacitor circuit may be a variable capacitor and/or inductor that provides a change of the impedance of the RF circuitry including the support pins themselves. In an embodiment where a variable capacitor is used to control the impedance, a stepper motor drive mechanism may be used to precisely control the variable capacitor such that the RF impedance at a particular substrate support pin may be operated at any of or in combination with inductive, capacitive, series or parallel resonant impedance conditions. In an embodiment, a method is taught on how to control and/or track the impedance at each substrate support pin in real time during a deposition process such that the local area impedance, as measured by the voltage, current and phase detectors are significantly similar, or otherwise appears to be not similar but to follow a certain pattern of spatial distribution such that the local film properties as a result, are significantly similar (e.g., thickness) as compared to the same found on the bulk film depositions.

The disclosure also teaches methods where the local impedance of each substrate support pin tracks each other and, further, tracks the impedance of the output of the matching network (bulk impedance) coupled to the plasma chamber RF coils. The matching network provides impedance matching of the global impedance of the plasma chamber to the impedance (50-ohms) of a RF generator so that maximum RF power may be delivered to the bulk plasma in the processing chamber.

It is further recognized based on the data obtained from the each one of the local arrays of voltage, current and phase detectors that the methods for optimizing local impedances for a particular process film chemistry may include, but is not limited to, those including of a variety of dielectric films including silicon nitride, silicon oxide, silicon oxides-nNitride, TEOS-based films, for example, or other dielectric or non-dielectric, semiconductor, or metal containing films of single layer or multiple-layer stack films used for semiconductor devices, flat panel display, and solar panel device applications for improved film quality uniformity across the entire substrate area. It is contemplated and with the scope of this disclosure that either the local impedances may be significantly close to or are essentially the same as the chamber global impedance, or that the impedances are different but follow a predetermined relationship with respect to the global chamber impedances. Such desired impedance relationships may be in one example a linear one, or in other examples a non-linear one.

Embodiments of the disclosure include a plasma-enhanced chemical vapor deposition (PECVD) processing chamber that is operable to form one or more layers or films on a substrate. The plasma processing chamber as disclosed herein may be adapted to deliver energized species of a precursor gas that are generated in a plasma. The plasma may be generated by inductively coupling energy into a gas under a vacuum. It is to be understood that the embodiments discussed herein may be practiced in other chambers capable of providing high density plasma.

Referring to FIG. 1, depicted is a schematic cross-sectional front view of a plasma processing system with a substrate support in a first position, according to an embodiment. A plasma processing system 10 may comprise a plasma processing chamber 100, a gas source 104, a radio frequency (RF) power source 108, an impedance matching network 106, RF coils 120, a substrate support 122 attached to a support leg 116 forming a substrate support assembly 118, and actuator 114. The plasma processing chamber 100 is comprised of a chamber lid 102, a chamber base 112 disposed opposite the chamber lid 102 and side walls 110. The substrate support 122 is disposed between the chamber lid 102 and the chamber base 112. The chamber lid 102 is disposed at an upper end of the plasma processing chamber 100, and the substrate support 122 is disposed within the plasma processing chamber 100.

Figure 2:
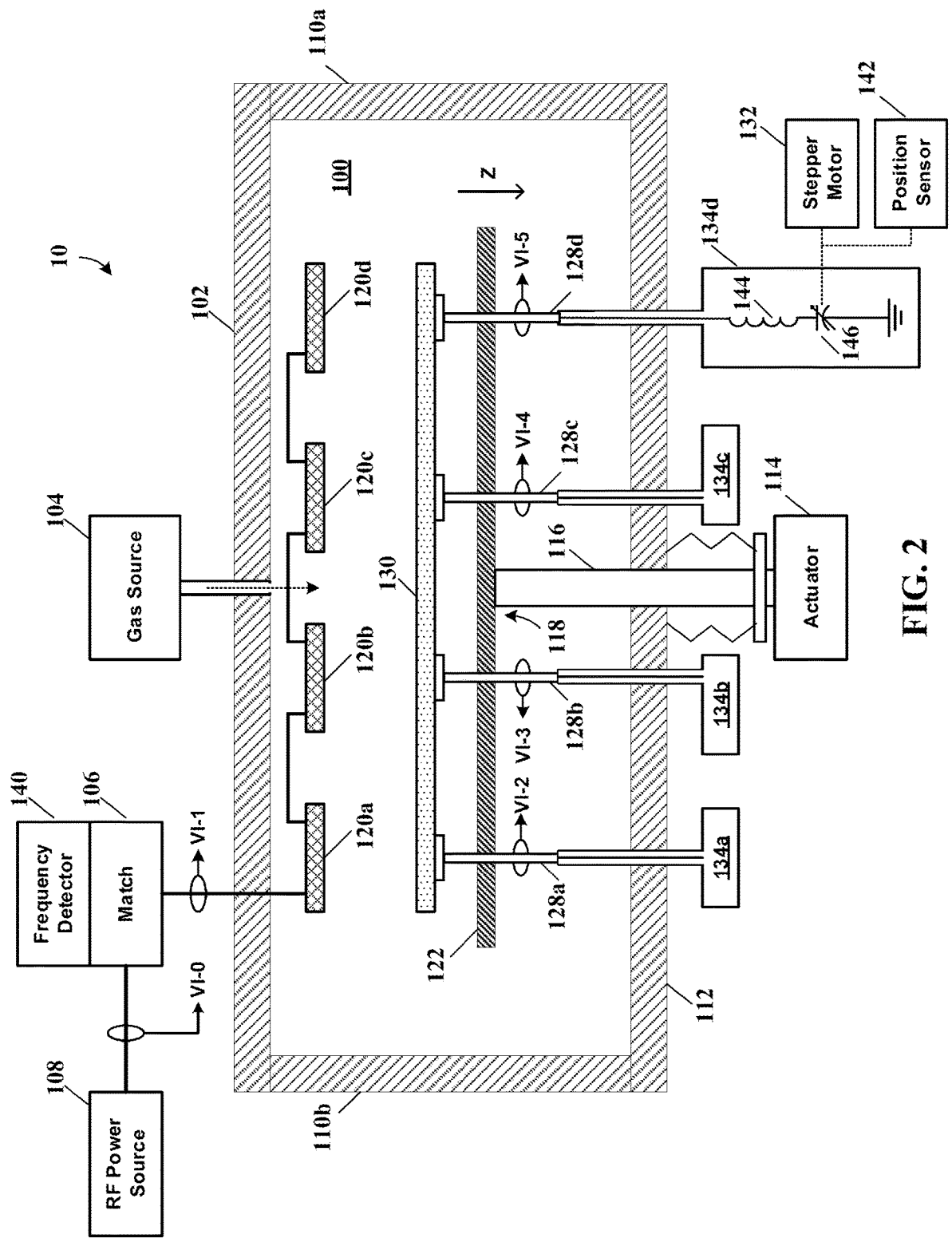
FIG. 2 illustrates a schematic cross-sectional front view of a plasma processing system with a substrate support in a second position, according to an embodiment.

An exemplary substrate 130 is shown on the substrate support 122 within the plasma processing chamber 100. The substrate support 122 is adapted to hold the substrate 130 during processing thereof. The support leg 116 is coupled to an actuator 114 that is adapted to move the substrate support assembly 118 vertically (in the Z direction) within the plasma processing chamber 100. The substrate support assembly 118 shown in FIG. 1 is in a first processing position. However, the substrate assembly 118 may be lowered in the Z direction to a second position, as shown in FIG. 2, so that the substrate 130 may be easily removed without damage thereto. Not all elements of the plasma processing system 10 are shown for purposes of clarity.

A process gas source 104 is coupled into the processing chamber 100 and provides a process gas to be turned into a plasma by radio frequency energy transmitted from plasma generating inductively coupled RF coils 120. The inductively coupled RF coils 120 may be a single RF coil 120, or at least two inductively coupled RF coils 120 coupled in series, and hereinafter may be referred to as inductively coupled RF coil 120. Each of the inductively coupled RF coils 120 may be coupled through a RF impedance matching network 106 to a RF power source 108 and ground 136. Although FIGS. 1 and 2 depict each of the inductively coupled RF coils 120 connected in series to the RF power source 108 and ground 136, a connection in parallel is also contemplated and within the scope of this disclosure such that each inductively coupled RF coil 130 may be connected and controlled independently to the RF power source 108 and ground 136. In some embodiments, RF ground 136 may be through a capacitor (not shown). The RF power source 108 may include an impedance matching network 106 adapted for matching the output impedance (e.g., 50-ohms) of the RF power source 108 to the chamber operating process impedance electrical characteristics for maximum RF power transfer.

RF voltage and RF current detectors (sensors) represented by VI-0 . . . VI-5 may be used to determine RF parameters useful for plasma processes. In addition, a frequency detector 140 may be utilized in combination with the detected voltage, current and phase values in determining circuit node impedances. As shown in FIGS. 1 and 2, the RF voltage and RF current detectors VI-0 . . . VI-5 and frequency detector 140 may be used to determine RF power and complex impedances in real time for the RF power source 108, RF impedance matching network 106 and the plurality of substrate support pins 128a-d. The substrate support pins 128 may be, for example but are not limited to, made of aluminum with ceramic (Alumina) sleeves.

Phase angle is determined by the lead or lag times between the RF voltage V(t) and RF current I(t) waveforms and is expressed in degrees θ. RF power P(t) is the product of voltage and current, or P(t)=V(t)*I(t), while the respective RMS (root-mean-square) values after detection are P=V*I*cos θ, where θ is the phase angle between the voltage and current waveforms. Using Ohm's Law Z(t)=V(t)/I(t) or Z may be expressed as Z=R+jX, where R=Z cos θ and jX=Z sin θ. jX=jωL−j/ωC, where ω=2πf, f is in frequency, C is in farads and L is in henrys. R is resistance in ohms and jX is reactance in ohms, where +jX is inductive reactance and −jX is capacitive reactance. Power is frequency independent and impedance is frequency dependent.

Figure 3:
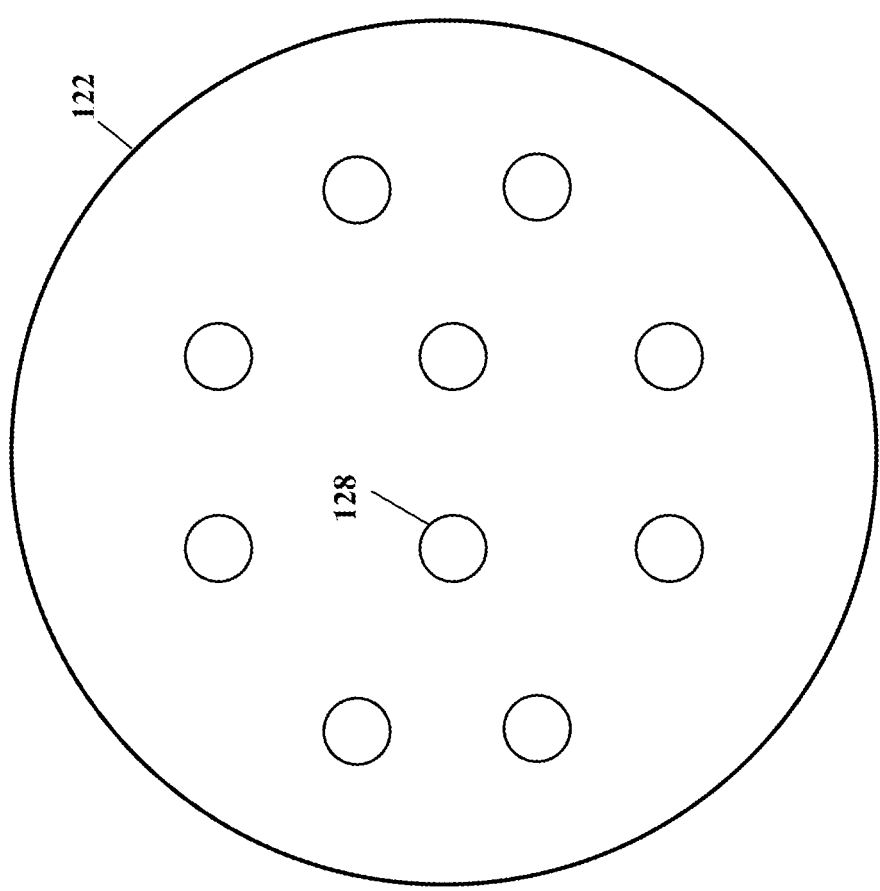
FIG. 3 illustrates a top plan view of a substrate support and substrate support pins therein, according to an embodiment.

Referring to FIG. 3, depicted is a top plan view of a substrate support and substrate support pins therein, according to an embodiment. A plurality of openings are sized and arranged through front and back faces of the body of the substrate support 122 so that a plurality of substrate support pins 128 may pass through the body of the substrate support 122. Referring back to FIG. 1, when the substrate support 122 is in an elevated (up) first position the top faces of the substrate support pins 128 are flush with or below the top surface (face) of the substrate support 122. This allows the bottom of the substrate 130 to be in contact with the top surface (face) of the substrate support 122.

The substrate 130 is typically processed in a tool that has multiple chambers, e.g., 100, such as a cluster tool (not shown), and the substrates 130 are transferred into and out of the various chambers 100 that perform different processing operations to form the electronic devices thereon. To facilitate transfer of the substrate 130 into and out of the chambers 100, the substrate support pins 128 remain stationary when the substrate support assembly 118 is lowered in the Z direction and will thereby extend through an upper surface of the substrate support 122. The substrate support pins 128 may be moveably retained inside a roller bushing assembly (not shown) of the substrate support 122. The roller bushing assembly allows the CGT pins to move up and down in relation to the chamber base 112 and the substrate support 122 during wafer processing, but is kept stationary when the substrate support assembly 118 has reached its lowest Z-position. At this time the end portions of the substrate support pins 128 are in contact with the bottom plate of the chamber base 112.

Thus the bottom of the substrate 130 rests on the top surfaces (faces) of the substrate support pins 128, spacing apart the bottom surface of the substrate 130 with the top surface of the substrate support 122 (FIG. 2). This spacing allows a transfer mechanism, such as a robot blade or end effector (not shown), to move between the bottom of the substrate 130 and the top surface of the substrate support 122, then lift the substrate 130 off the substrate support pins 128 without causing damage to the substrate support 122 or the substrate 130. When the substrate support 122 is raised (FIG. 1) the substrate support pins 128 realign with the substrate support 122, forming a substantially planar surface again and placing the substrate 130 into contact with the top surface of the substrate support 122 for processing.

Figure 4:
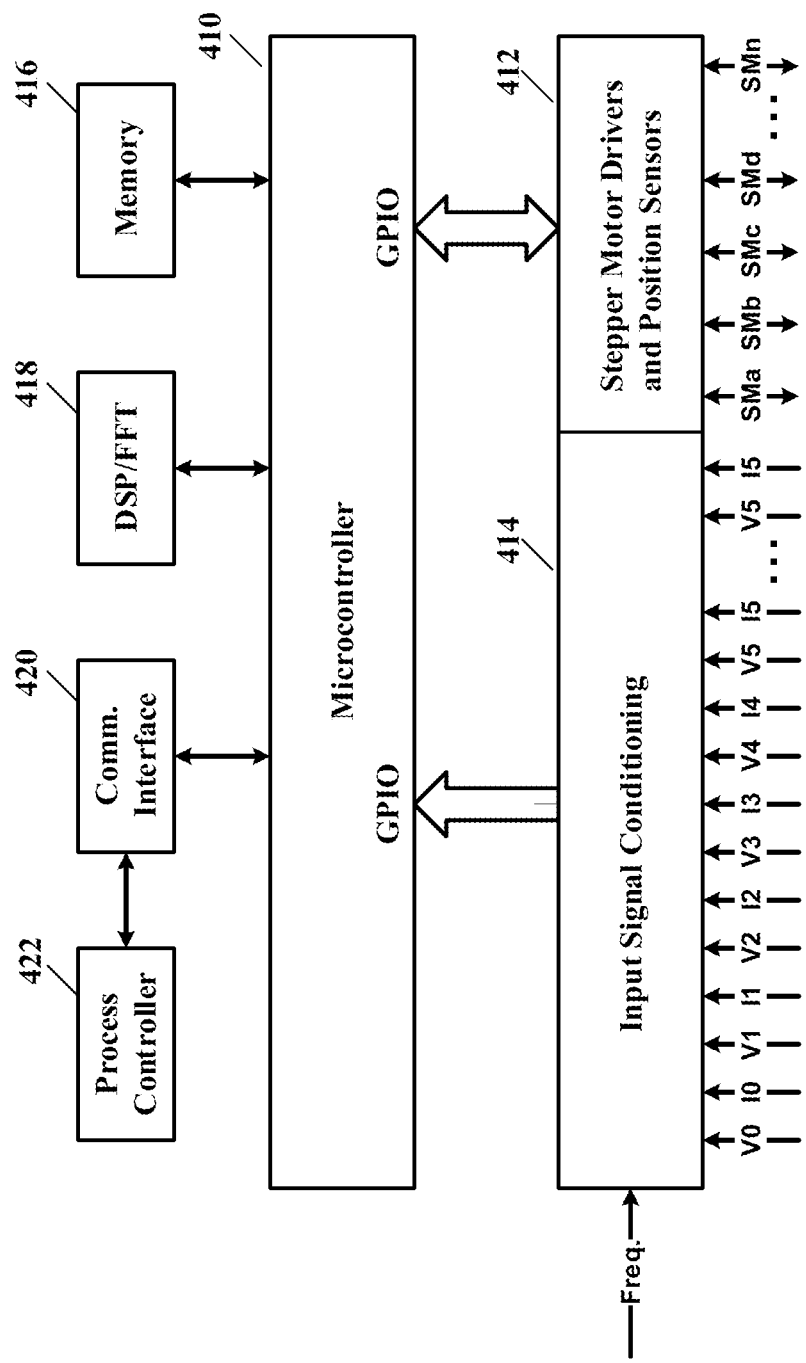
FIG. 4 illustrates a schematic block diagram of a circuit for controlling RF impedance of local areas of a substrate, according to an embodiment.

Each of the substrate support pins 128 may be coupled to an adjustable impedance 134. The adjustable impedance 134 may be, for example but is not limited to, a series connected inductor 144 and capacitor 146, as shown in FIGS. 1 and 2. This impedance may be varied (adjusted) remotely with, for example but not limited to, a stepper motor 132 controlled by a microcontroller 410 (FIG. 4). A variable capacitor 146, such as a vacuum variable capacitor for high power operation, and/or a variable inductor for the inductor 144 may be controlled by the stepper motor 132. Optionally, a position sensor 142 may be coupled to the stepper motor 132 or variable capacitor drive mechanism for determining the setting or position of the variable capacitor 146 so that the capacitance value of the capacitor 146 may be determined and/or preset to a desired capacitance.

Each adjustable impedance circuit 134 may be independently adjusted and controlled to provide for improved deposition or etching results for a plasma process at the associated areas of the substrate support pins 128. These local impedance adjustments may be static or dynamic during a plasma process. For example, during a plasma process, if the bulk impedance changes then the local impedances of the substrate support pins 128 may be similarly changed by the associated adjustable impedance circuits 134.

Referring to FIG. 4, depicted is a schematic block diagram of a circuit for controlling RF impedance of local areas of a substrate, according to an embodiment. The computational and control system for impedance control includes a microcontroller 410, a memory (volatile and/or non-volatile) 416, a communications interface 420, input signal conditioning 414, and stepper motor drivers and position sensors 412. In addition, the microcontroller 410 may have a digital signal processing (DSP) and fast Fourier transform (FFT) capabilities in either an internal core processor or an external DSP/FFT processor 418. The voltage V(t) and current I(t) and frequency (f) data from each of the RF voltage and current detectors VI, and the frequency detector 140 may be input in real time to the microcontroller 410. The microcontroller 410 may then determine individual impedances at each location of the substrate support pins 128 and control same.

The microcontroller 410 may further provide general purpose inputs and outputs (GPIO) for coupling to the input signal conditioning 414, and the stepper motor drivers and position sensors 412. The microcontroller 410 may also be adapted for communications through the communications interface 420 with a process controller 422. The process controller 422 may further optimize the plasma processes by controlling the impedance of each of the substrate support pins 128 in real time and other plasma process variables. The impedance information received by the process controller 422 may be used for machine learning to improve the various plasma production processes. The machine learning may further be utilized in artificial intelligence (AI) systems for optimization of the plasma processes.

The communications interface 420 may be adapted for communicating with protocols such as, for example but is not limited to, Ethernet for Control Automation Technology (EtherCAT) or (ECAT) compliance and serial RS-232, Ethernet, WiFi and Bluetooth communications with user interfaces, e.g., laptop computer, and plasma chamber tools.

Figure 5:
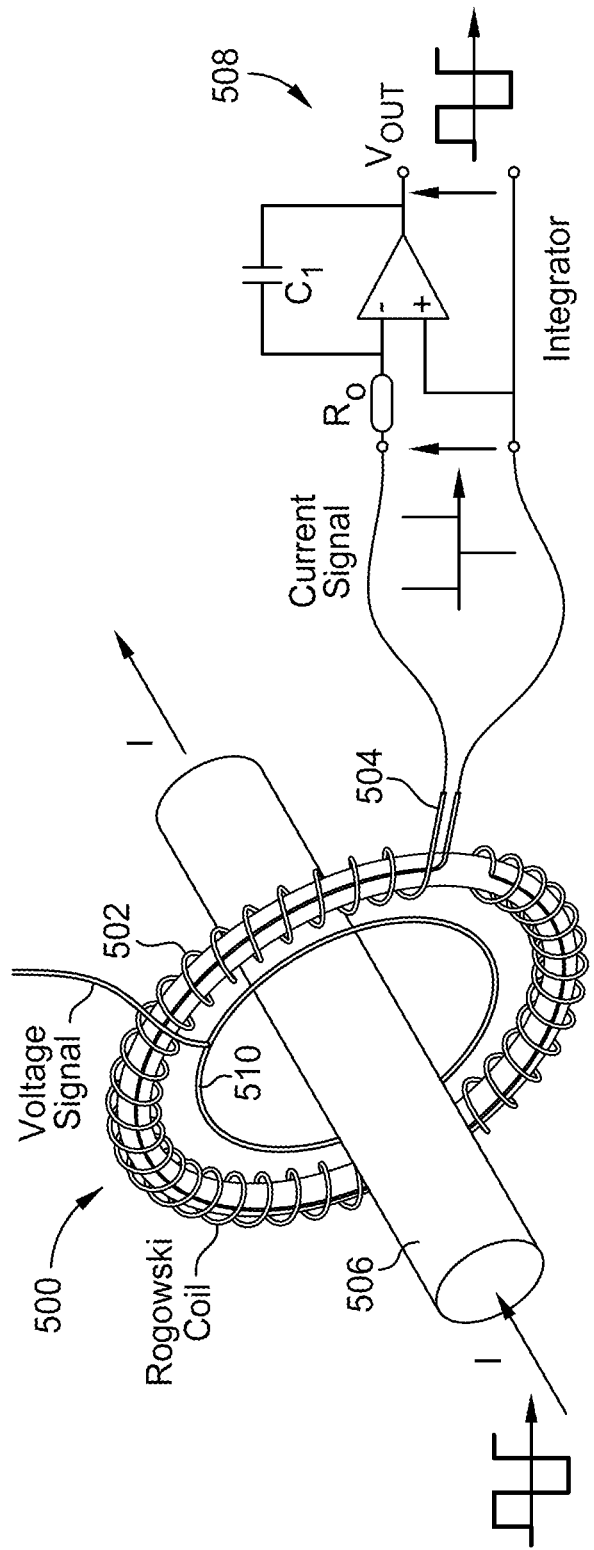
FIG. 5 illustrates a schematic isometric drawing of RF voltage and current detectors, according to an embodiment.

Referring to FIG. 5, depicted is a schematic isometric drawing of RF voltage and current detectors, according to an embodiment. A Rogowski coil 500 for measuring alternating current (AC) or high-speed current pulses is shown. The Rogowski coil 500 may comprise a helically wound coil 502 with the lead from one end returning through the center of the coil 502 to the other end so that both terminals are at the same end 504 of the coil 502. This approach is sometimes referred to as a "counter-wound Rogowski coil." The coil 502 encircles a straight conductor 506 (RF conductor from RF power source 108 to RF coils 120) whose current is to be measured. A voltage is induced in the coil 502 that is proportional to the rate of change (derivative) of current in the straight conductor 506, the output of the Rogowski coil 500 is connected to an electronic integrator circuit 508 for providing an output signal that is proportional to the current in the conductor 506. It is contemplated and within the scope of this disclosure that any shape of the coil 500 may be implemented, such as but is not limited to, square, circular, rectangular, or hexagon; and may be fabricated on a printed circuit board. A voltage detection coil 510 may be used for detecting the RF voltage on the conductor 506. The voltage detection coil 510 may use both capacitive and inductive coupling to the conductor 506 and has a high impedance when referenced to common or ground.

Figure 6B:
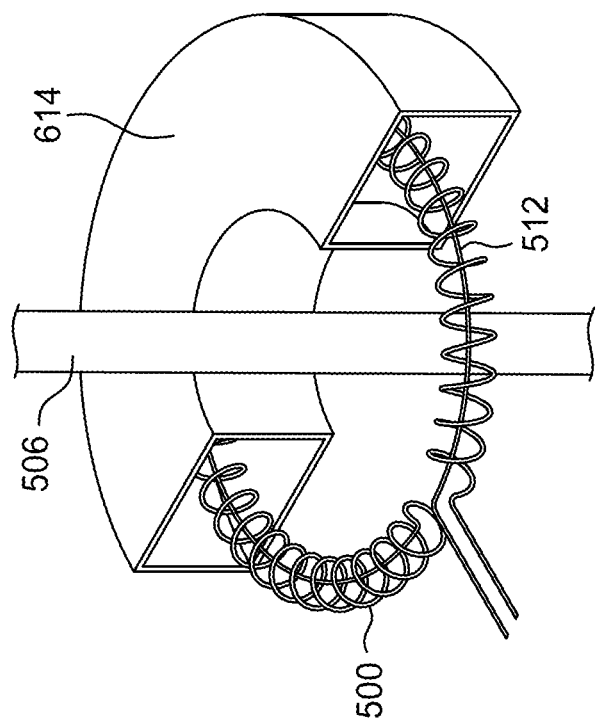
FIGS. 6A-6B illustrates schematic plan and isometric drawings of a Rogowski coil RF current detector shown in FIG. 5, according to an embodiment.
Figure 6A:
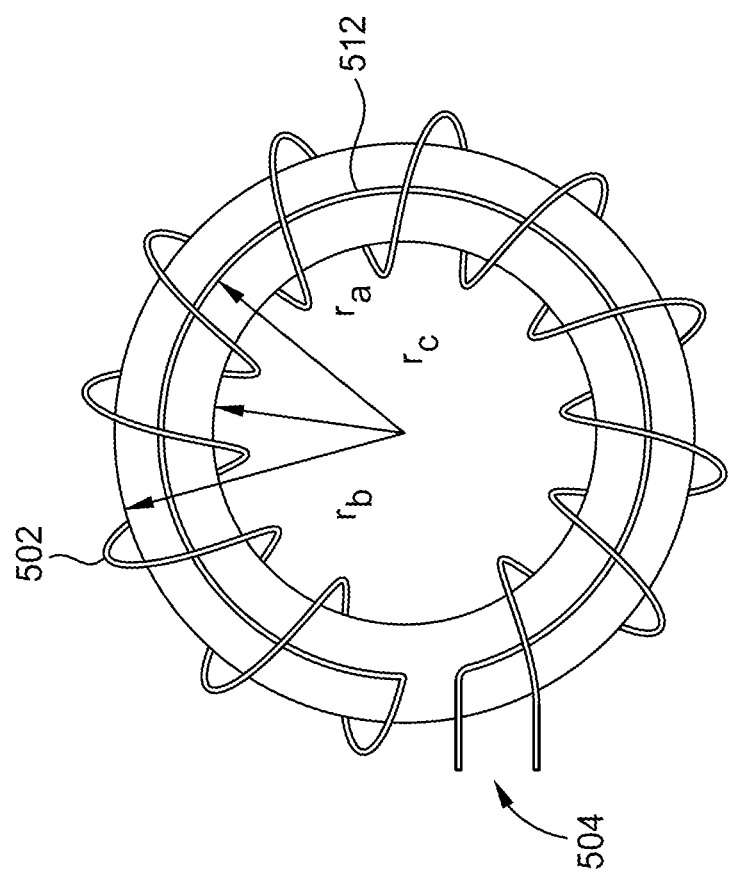

Referring to FIG. 6, depicted are schematic plan and isometric drawings of a Rogowski coil RF current detector shown in FIG. 5, according to an embodiment. In FIG. 6(a), return wire loop 512 is shown for the coil 502. In FIG. 6(b) an electrostatic shield 614 is shown encircling the coil 500. The return wire loop 512 and electrostatic shield 614 may be implemented together with a printed circuit board.

Figure 7B:
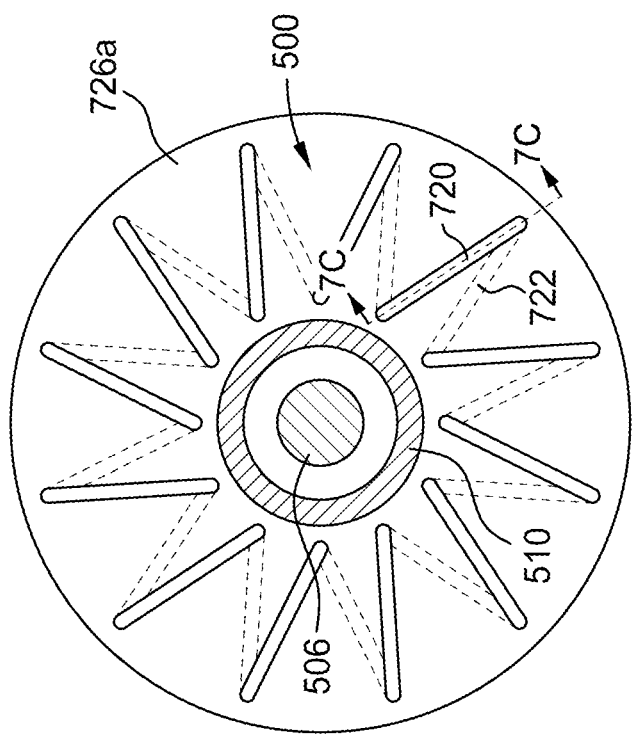
FIGS. 7A-7C illustrates a schematic plan drawing of RF voltage and current sensors fabricated on a printed circuit board, according to an embodiment.
Figure 7C:
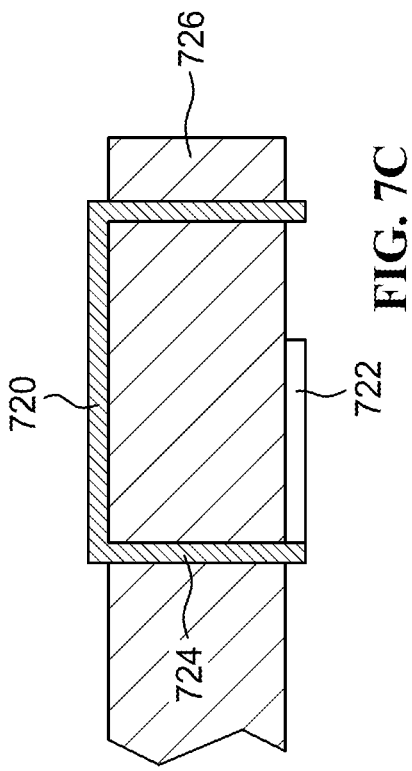
Figure 7A:
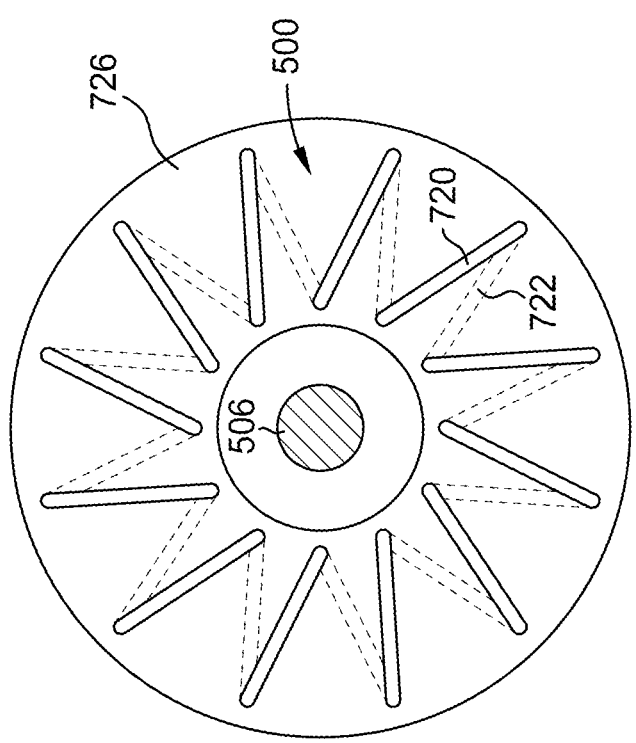

Referring to FIG. 7, depicted is a schematic plan drawing of RF voltage and current detectors fabricated on a printed circuit board, according to an embodiment. RF voltage and current detectors may be implemented on a printed circuit board (PCB) 726, for example but not limited to, in a form factor accommodating a RF conductor 506. A rectangular plan view is shown in (a) and may be implemented on a multiple layer PCB 726 with the top and bottom conductors 720 and 722, respectively, connected with vias 724 as shown in (b). A voltage detection coil 510 may also be fabricated on the PCB 726.

FIG. 7(c) shows an example implementation of RF voltage and current detectors in a multiple layer PCB, and is considered a feature of the embodiments disclosed herein. An electrostatic shield of the active sensor circuits may be enclosed within metal shielding layers implemented either in the same or on different layers of the multiple layer PCB 726a. The PCB may have shielding layers that occupy the entire respective layer, or partially, if the shielding is sufficient to prevent any RF noise or harmonics of undesired frequencies from coupling into the active sensor circuitry. Active circuits may be isolated from outside influence such that a RF shielded enclosure protects the active electronic circuits associated with the RF voltage and current detectors with grounding vias that connect to the conductive shielding layers. Such grounding vias may assume a sparse or sufficiently dense pattern such that electromagnetic energy from outside and inside (not intended to be measured) of the chamber is substantially prevented from affrecting measurements by the RF voltage and current detectors of the plasms processing chamber. The shielding layers (not shown) may be grounded to the chamber 100.

The methods, apparatus, and systems provided herein enable RF power processes for depositing films with uniform thickness over a large substrate area.

What is claimed is:
1. A plasma processing system, comprising:
  a substrate support disposed within a processing volume of the plasma processing system, the substrate support comprising a body having a plurality of openings formed between a substrate support surface and backside opposite the substrate support surface;

a plurality of substrate support pins deposed in the plurality of openings of the substrate support, wherein when the substrate support is in a raised position, top portions of the plurality of substrate support pins are planar with or recessed below the substrate support surface, and when in a lowered position the substrate support pins extend above the substrate support surface;
a plurality of adjustable impedance circuits in electrical communications with associated ones of the plurality of substrate support pins; and
radio frequency (RF) voltage and RF current detectors electrically coupled to each of the plurality of adjustable impedance circuits.

2. The plasma processing system of claim 1, further comprising:
a substrate support leg attached to the backside of the substrate support; and
an actuator attached to the substrate support leg and adapted to raise and lower the substrate support leg with the attached substrate support.

3. The plasma processing system of claim 2, wherein phase angles (θ) between each of the detected RF voltages and the detected RF currents are determined with a phase detector.

4. The plasma processing system of claim 1, wherein each of the plurality of adjustable impedance circuits comprise an inductor and a capacitor having an adjustable capacitance.

5. The plasma processing system of claim 4, wherein each of the plurality of adjustable impedance circuits comprise a position sensor coupled to a stepper motor.

6. The plasma processing system of claim 1, wherein adjustment of each of the plurality of adjustable impedance circuits is remotely controlled.

7. The plasma processing system of claim 1, wherein
the substrate support is adapted to support a substrate when in the raised position; and
the plurality of substrate support pins are adapted to support the substrate when the substrate support is in the lowered position.

8. The plasma processing system of claim 1, wherein the RF voltage and RF current detectors comprise:
a voltage detection coil adapted for detecting a RF voltage on an electrical conductor; and
a Rogowski coil adapted for detecting RF current through the electrical conductor;
wherein the voltage detection coil and the Rogowski coil are fabricated on multiple layers of a printed circuit board (PCB).

9. The plasma processing system of claim 8, further comprising RF conductive shielding on certain layers of the PCB.

10. The plasma processing system of claim 8, wherein the voltage detection coil is disposed around a substrate support pin of the plurality of substrate support pins.

11. The plasma processing system of claim 8, wherein the Rogowski coil comprises a helically wound coil having a lead from one end returning through the center of the coil.

12. The plasma processing system of claim 1, wherein each adjustable impedance circuit of the plurality of adjustable impedance circuits is individually controlled.

13. A plasma processing system, comprising:
a plasma processing chamber;
at least one plasma generating radio frequency (RF) coil within an upper portion of the plasma processing chamber;
a RF power source;
a RF impedance matching network coupled between the RF power source and the at least one plasma generating RF coil;
a frequency detector;
first RF voltage and RF current detectors electrically coupled between the RF impedance matching network and the at least one plasma generating RF coil;
a substrate support disposed within the plasma processing chamber and below the at least one plasma generating RF coil, the substrate support comprising a body having a plurality of openings formed between a substrate support surface and a backside opposite the substrate support surface;
a plurality of substrate support pins deposed in the plurality of openings of the substrate support, wherein when the substrate support is in a raised position, top portions of the plurality of substrate support pins are planar with or recessed below the substrate support surface, and when in a lowered position the substrate support pins extend above the substrate support surface;
a plurality of adjustable impedance circuits in electrical communications with associated ones of the plurality of substrate support pins; and
second RF voltage and RF current detectors electrically coupled to each of the plurality of adjustable impedance circuits for detecting RF voltage and RF current thereof.

14. The plasma processing system of claim 13, wherein each of the plurality of adjustable impedance circuits comprises an inductor and a capacitor having an adjustable capacitance.

15. The plasma processing system of claim 13, further comprising a monitoring and control system providing:
a plurality of inputs coupled to the first RF voltage and RF current detectors, and the second RF voltage and RF current detectors associated with each of the plurality of adjustable impedance circuits;
an input coupled to the frequency detector; and
a plurality of outputs adapted to control impedance adjustments of the plurality of adjustable impedance circuits.

16. The plasma processing system of claim 15, wherein the monitoring and control system:
determines phase angle (θ) between each pair of detected first and second RF voltages and RF currents;
determines a first impedance at an output of the RF impedance matching network;
determines second impedances of each of the plurality of adjustable impedance circuits; and
controls impedance adjustments of the plurality of adjustable impedance circuits.

17. The plasma processing system of claim 16, wherein the monitoring and control system adjusts the second impedances of the plurality of adjustable impedance circuits to be proportional to the first impedance of the RF impedance matching network.

18. The plasma processing system of claim 16, wherein the monitoring and control system remotely controls adjustment of each of the plurality of adjustable impedance circuits.

19. The plasma processing system of claim 15, wherein the monitoring and control system comprises a microcontroller having:
a memory;
digital signal processing capabile of performing complex mathematical calculations and Fourier transform (FFT) capabilities;

general purpose inputs and outputs (GPIO) adapted for coupling to the plurality of inputs and the plurality of outputs; and a communications interface for communicating with a master control system and a user interface.

20. The plasma processing system of claim 15, wherein the communications interface is adapted for communicating with Ethernet for Control Automation Technology (EtherCAT).

* * * * *